United States Patent [19]
Itaya et al.

[11] Patent Number: 5,343,486
[45] Date of Patent: Aug. 30, 1994

[54] SEMICONDUCTOR LASER DEVICE

[75] Inventors: Kazuhiko Itaya, Tokyo; Genichi Hatakoshi; Koichi Nitta, both of Yokoyama, all of Japan

[73] Assignee: Kabushiki Kaisha Toshiba, Kawasaki, Japan

[21] Appl. No.: 962,725

[22] Filed: Oct. 19, 1992

[30] Foreign Application Priority Data

Oct. 21, 1991 [JP] Japan .................................. 3-272910

[51] Int. Cl.$^5$ .............................................. H01S 3/15
[52] U.S. Cl. ........................................ 372/43; 372/46
[58] Field of Search ...................... 372/45, 46, 50, 43

[56] References Cited

U.S. PATENT DOCUMENTS 4,653,059 3/1987 Akiba et al. .
4,941,148 7/1990 Yoshida et al. ..................... 372/96

FOREIGN PATENT DOCUMENTS 0297885 1/1989 European Pat. Off. .
2222307 2/1990 United Kingdom .

OTHER PUBLICATIONS

Yonezu, et al., IEEE Journal of Quantum Electronics, vol. QE-15, No. 8, Aug. 1979, pp. 775-781. "An AIGaAs Window Structure Laser".
Soviet Technical Physics Letters, vol. 14, No. 2, Feb. 1988, pp. 119-121, K. Yu. Kizhaev, et al., "Lasing in InGaAsP/InP Distributed-Feedback Lasers with a Large Difference Between the Bragg Wavelength and the Gain Maximum of the Active Layer".
Electronic Letters, vol. 27, No. 8, Apr. 11, 1991, pp. 661-662, H. Hamada, et al., "High-Power Operation of 630nm-Band Transverse-Mode Stabilised AlGAInP Laser Diodes with Current-Blocking Region Near Facets".
Electronics Letters, vol. 26, No. 20, Sep. 27, 1990, pp. 1726-1728, Y. Ueno, et al., "Continuous-Wave High-Power (75mW) Operation of a Transverse-Mode Stabilised Window-Structure 680nm AlGaInP Visibile Laser Diode".
Patent Abstracts of Japan, vol. 15, No. 351 (E-1108), Sep. 5, 1991, JP-A-31 36 388.

*Primary Examiner*—Rodney B. Bovernick
*Assistant Examiner*—Robert E. Wise
*Attorney, Agent, or Firm*—Oblon, Spivak, McClelland, Maier & Neustadt

[57] ABSTRACT

According to this invention, a semiconductor laser device includes a compound semiconductor substrate, a double hetero structure formed on the compound semiconductor substrate and having an active layer and first and second cladding layers which interpose the active layer, a current blocking region formed in one facet portion of the double hetero structure in a resonator direction. A reflecting layer is arranged on the other facet of the double hetero structure in the resonator direction and has a reflectance higher than that of a natural cleavage surface, thereby shifting the oscillation wavelength of the laser device to a long wavelength side with respect to the wavelength of spontaneous radiation emitted from one facet of the double hetero structure.

30 Claims, 5 Drawing Sheets

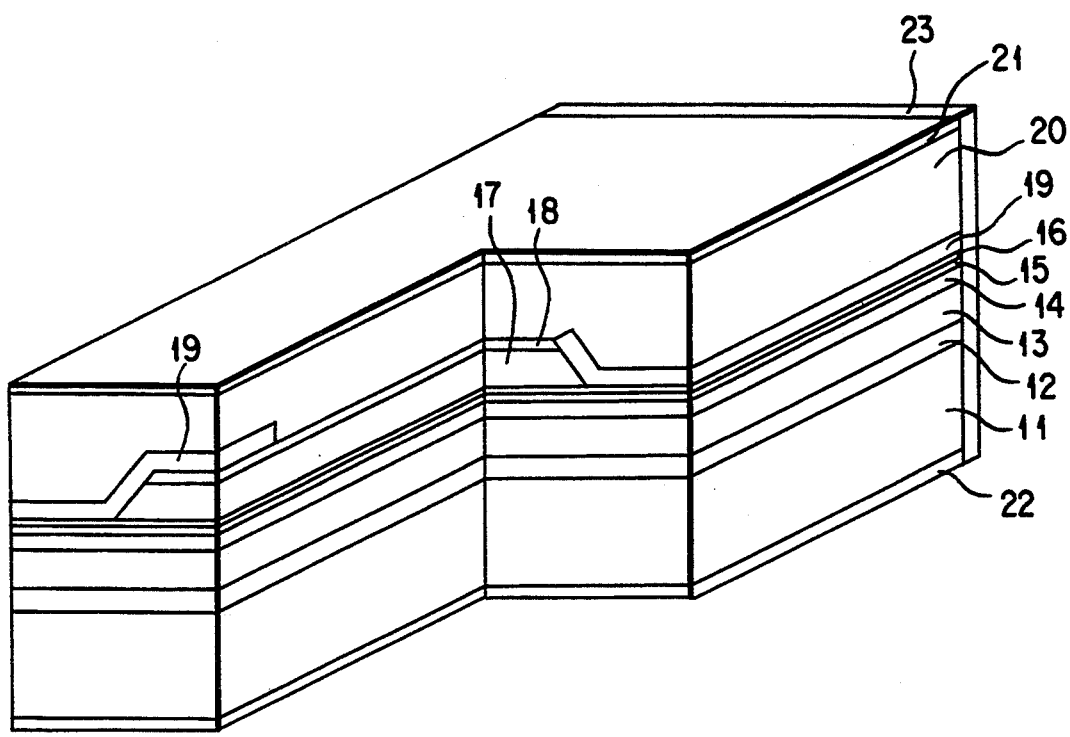
F I G. 1

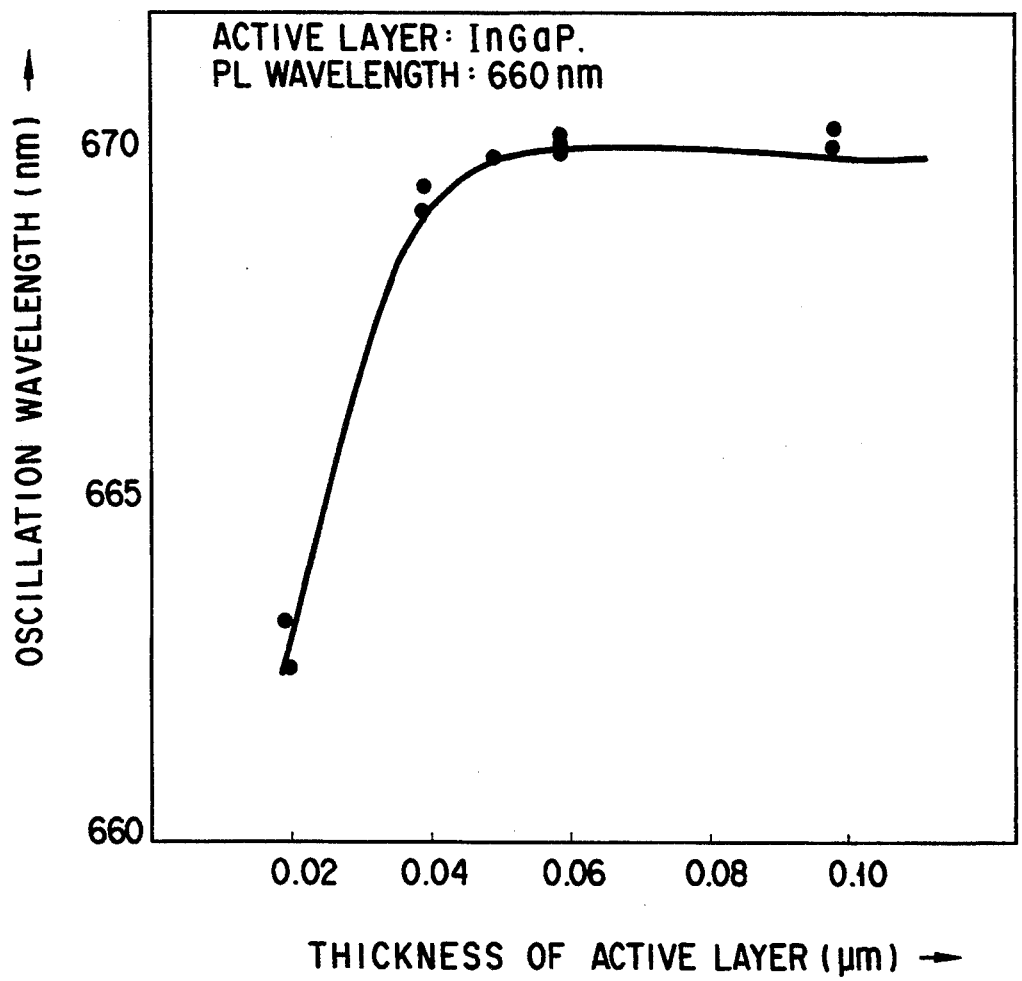
F I G. 2

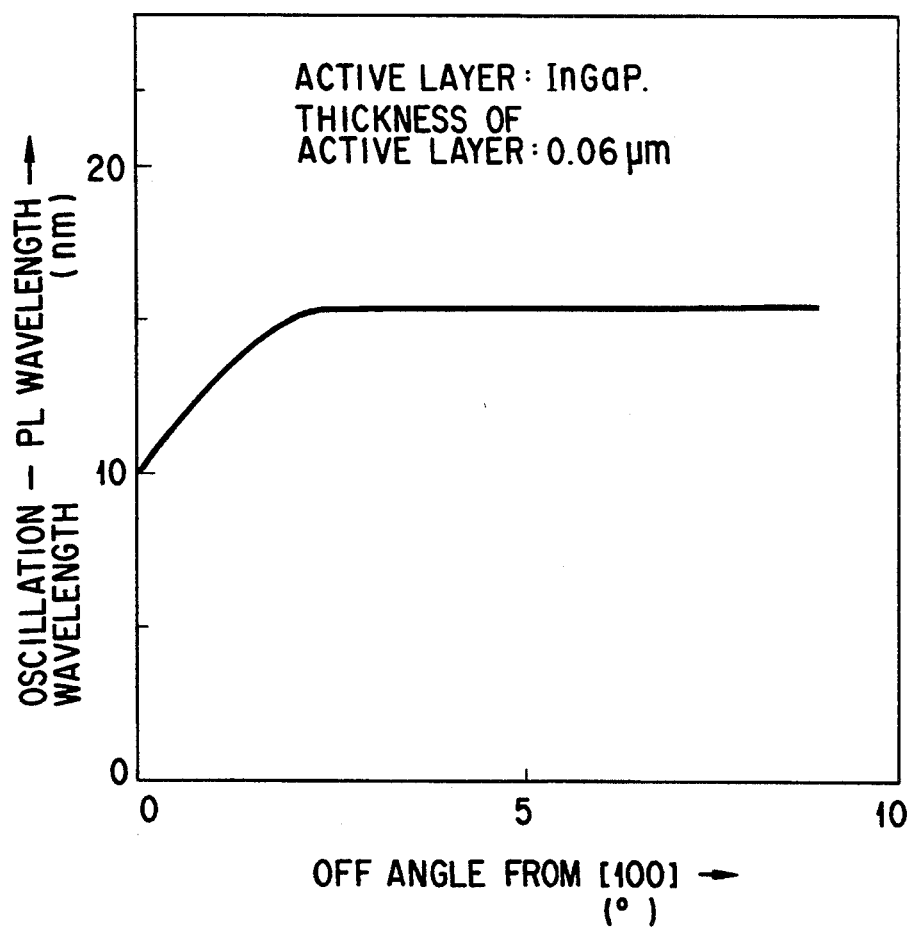
F I G. 3

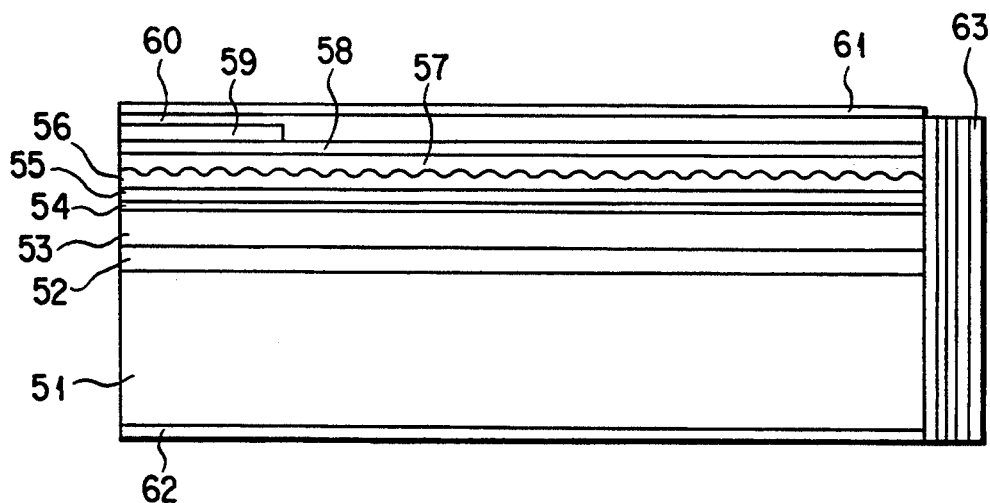
F I G. 5
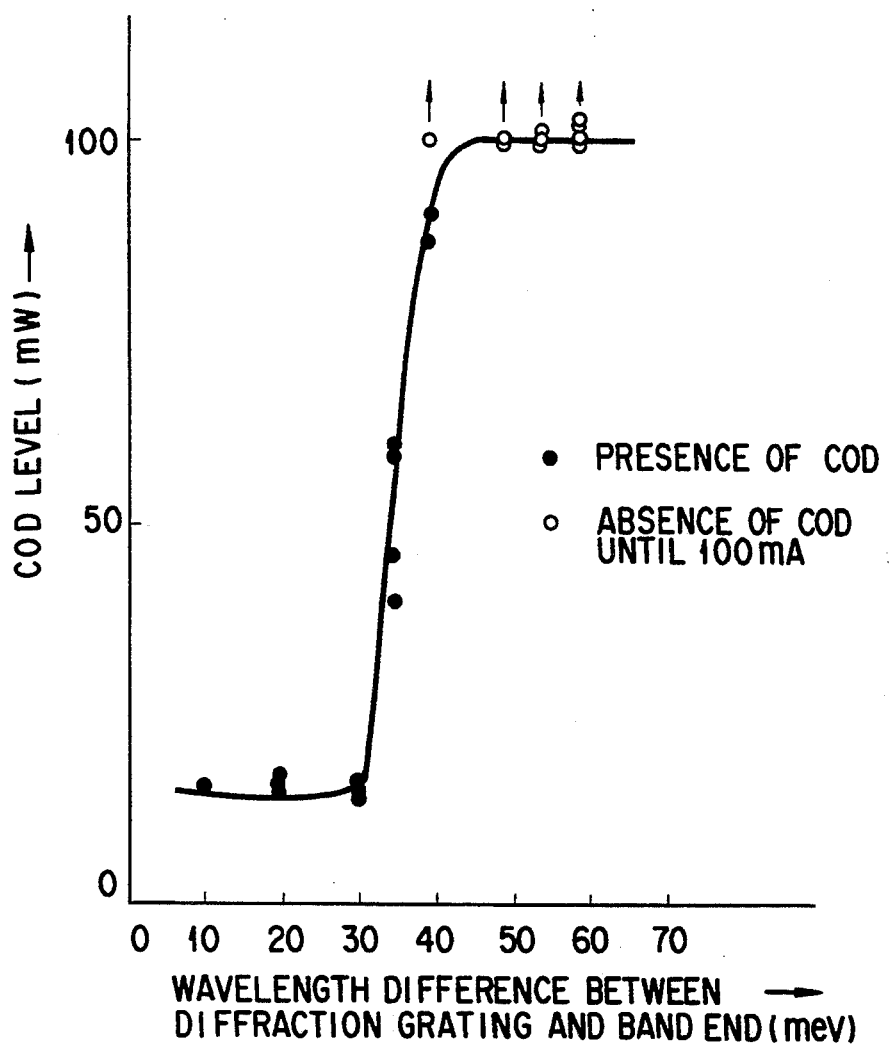
F I G. 6

SEMICONDUCTOR LASER DEVICE

BACKGROUND OF THE INVENTION

1. Field of the Invention

The present invention relates to a semiconductor laser device using a compound semiconductor material and, more particularly, a semiconductor laser device having a current blocking region in end face portions (facet portions) thereof in a resonator direction.

2. Description of the Related Art

In recent years, a semiconductor laser emitting a light of a short wavelength has been developed to be applied to a high-density optical disk system, a high-speed laser printer, a bar code reader, and the like. Under these circumstances, an InGaAlP laser having an oscillation wavelength in a 0.6-$\mu$m band (red region) and a GaAlAs laser having an oscillation wavelength in a 0.8-$\mu$m band (infrared region) have received a great deal of attention as a promising semiconductor laser emitting a light of a short wavelength. In addition, a high-output laser having a 30-mW output has been strongly demanded to be mainly applied to the field of optical disks or the like.

In order to answer the above demands, in recent years, a laser having a window structure for rendering the facet portions transparent to an oscillation wavelength, and a laser having a current blocking structure in which a current blocking region is formed in the facet portions have been proposed.

Since the facet portions in the laser having the window structure is transparent to the oscillation wavelength, COD (Catastrophic Optical Damage) caused by an increase in temperature of the facet portions can be prevented, and a very high output can be expected. For this reason, the technique of the laser having the window structure is regarded as an important technique required for realizing a 30-mW output and simultaneously realizing a high output and emission of a light of a short wavelength. However, complicated processes are required for manufacturing this laser.

On the other hand, the laser having the current blocking structure can be manufactured by relatively simple processes, and a high output can be expected by the following effect. An increase in temperature of facet portions of the laser is suppressed to suppress the recombination of carriers in the facet portions. However, the number of excited carriers in a current blocking region in the facet portions of the laser is less than the number of excited carriers in an injection region, and the bandgap of the facet portions are actually decreased. For this reason, the facet portions absorbs light having the oscillation wavelength, and a COD level is decreased, thereby disadvantageously limiting a high-output operation.

As described above, in a semiconductor laser having a conventional current blocking structure expected as a promising high-output semiconductor laser, the bandgap of an active layer in the facet portions are actually decreased to cause a decrease in COD level, thereby disabling a sufficiently high output.

SUMMARY OF THE INVENTION

It is an object of the present invention to provide a semiconductor laser device having a current blocking structure which is capable of suppressing light absorption in facet portions and has a high COD level and excellent light output characteristics.

According to an aspect of the present invention, there is provided a semiconductor laser device comprising a compound semiconductor substrate, a double hetero structure formed on the compound semiconductor substrate and including an active layer and first and second cladding layers which interpose the active layer, a current blocking region formed in at least one of facet portions of the double hetero structure in a resonator direction, and reflecting means arranged on at least one of the facets of the double hetero structure in the resonator direction and having a reflectance higher than that of a natural cleavage face.

According to another aspect of the present invention, there is provided a semiconductor laser device comprising a compound semiconductor substrate, a double hetero structure formed on the compound semiconductor substrate and including an active layer and first and second cladding layers which interpose the active layer, a current blocking region formed in at least one facet portions of the double hetero structure in a resonator direction, and a wavelength control structure for performing a control operation for shifting an oscillation wavelength of the active layer to a long wavelength corresponding to a bandgap that is smaller than a bandgap of the active layer by not less than 35 meV.

According to still another aspect of the present invention, there is provided a semiconductor laser device comprising a compound semiconductor substrate, a double hetero structure formed on the compound semiconductor substrate and including an active layer and first and second cladding layers which interpose the active layer, a current blocking region formed in at least one of the facet portions of the double hetero structure in a resonator direction, and means for shifting an oscillation wavelength of the laser device to a long wavelength side with respect to a wavelength of spontaneous radiation emitted from facets of the double hetero structure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a partially cutaway perspective view showing an arrangement of a semiconductor laser device according to the first embodiment of the present invention;

FIG. 2 is a graph showing a relationship between the thickness of an active layer and the oscillation wavelength of the semiconductor laser shown in FIG. 1;

FIG. 3 is a graph showing a relationship between the axial inclination angle of the major surface of the substrate from a [100] direction and a difference between an oscillation wavelength and a PL wavelength;

FIG. 5 is a sectional view showing an arrangement of a semiconductor laser according to the second embodiment of the present invention; and FIG. 6 is a graph showing a relationship between a COD level and a peak difference between a coupling wavelength of a diffraction grating and a bandwidth of the semiconductor laser shown in FIG. 5.

DETAILED DESCRIPTION OF THE PREFERRED EMBODIMENTS

Figure 4:
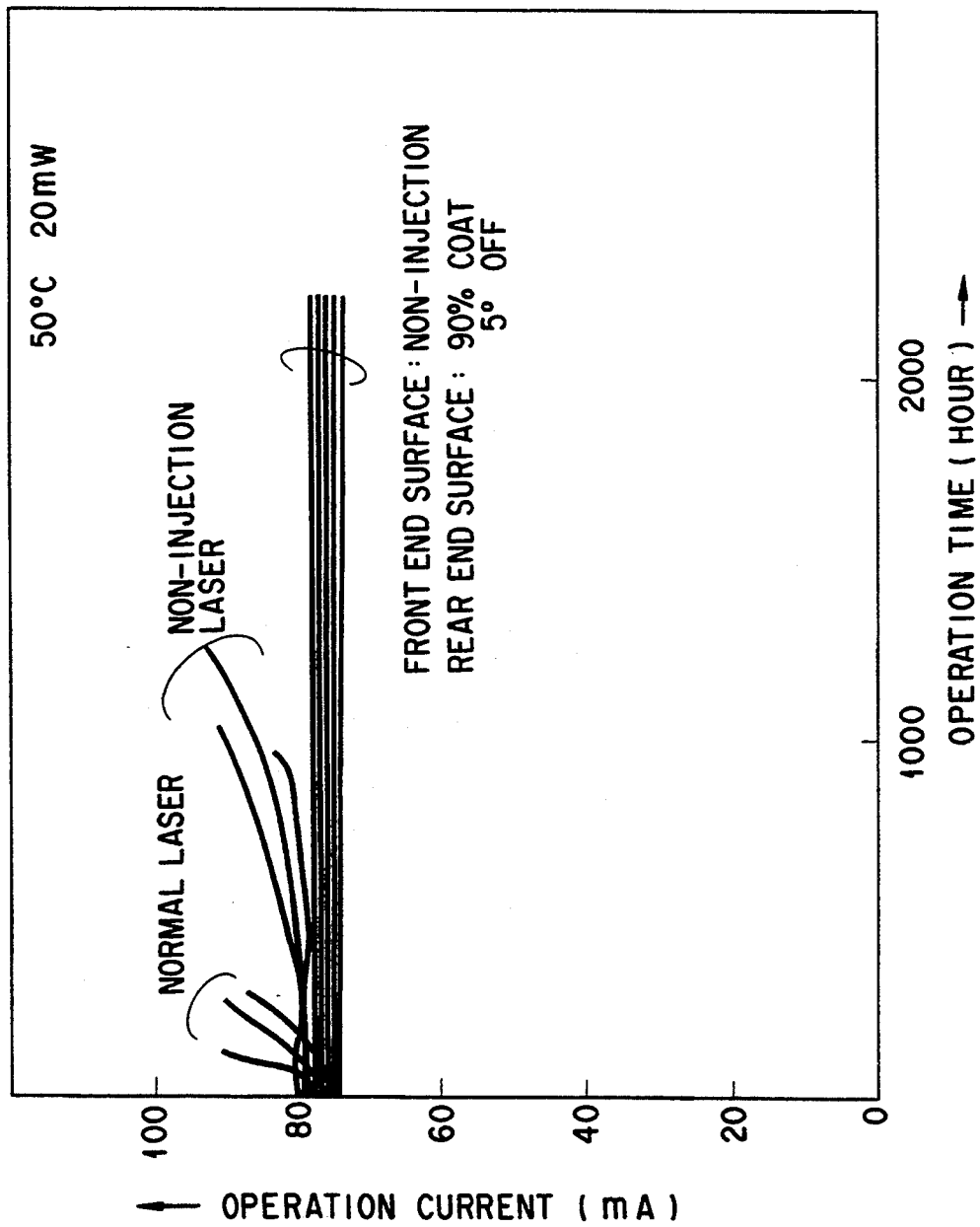
FIG. 4 is a graph showing the reliability of the semiconductor laser shown in FIG. 1 compared with the reliability of a conventional laser.

As the gist point of the present invention, in a semiconductor laser device having a current blocking structure, the peak wavelength (oscillation wavelength) of a gain is shifted to a long wavelength side to suppress light absorption in facet portions of the device.

As a means for shifting the peak wavelength (oscillation wavelength) of the gain to the long wavelength side, a highly reflective layer is arranged on one facet of the laser device in a resonator direction, or a wavelength control structure such as a diffraction grating is used.

When the highly reflective layer is arranged on the facet in the resonator direction, the oscillation wavelength is larger than that of a wavelength corresponding to the bandgap of an active layer. For this reason, the facet portion absorbs less light having the oscillation wavelength. As a result, a COD level is improved, and reliability of the device can also be improved.

In addition, when the wavelength control structure such as a diffraction grating is used, a COD level is improved as described above. More specifically, when the oscillation wavelength is set to be a wavelength corresponding to a bandgap that is smaller than that of the bandgap of an active layer by 35 meV or more, and more preferably, 40 to 80 meV or more, the COD level can be largely improved.

As preferable embodiments of the present invention, the following conditions (1) to (3) are given.

(1) The thickness of an active layer may be set to be 0.04 $\mu$m or more, and more preferably, set within a range of 0.04 to 0.1 $\mu$m.

(2) A GaAs substrate having a plane direction inclined at an angle of 2° or more, and more preferably, 5° to 15°, from [100] to [010] directions may be used as a semiconductor substrate, and a double hetero structure may consist of an InGaAlP-based material.

(3) A current blocking region may be formed in one facet portion of the device, and a highly reflective coating layer may be formed on the other facet opposite to the current blocking region.

various embodiments of the present invention will be described below.

FIG. 1 is a partially cutaway perspective view showing an arrangement of a semiconductor laser device according to the first embodiment of the present invention. In this embodiment, the peak wavelength (oscillation wavelength) of a gain is shifted to a long wavelength side by forming a highly reflective layer on a facet portion of the device in the resonator direction.

In FIG. 1, reference numeral 11 denotes an n-type GaAs substrate having a plane direction inclined at an angle of 5° from [100] to [001] directions. An n-type GaAs buffer layer 12 is formed on the substrate 11. On the buffer layer 12, a double heterojunction structure is formed. The double heterojunction structure is constituted by an n-type cladding layer 13 (Si-doped, 3 to $5\times10^{17}$ cm$^{-3}$) consisting of n-type $In_{0.5}(Ga_{0.3}Al_{0.7})_{0.5}As$, an active layer 14 (undoped) consisting of $In_{0.5}Ga_{0.5}P$, a p-type cladding layer 15 (Zn-doped, 3 to $5\times10^{17}$ cm$^{-3}$) consisting of p-type $In_{0.5}(Ga_{0.3}Al_{0.7})_{0.5}As$, a p-type etching stop layer 16 (Zn-doped, 3 to $5\times10^{17}$ cm$^{-3}$) consisting of p-type $In_{0.5}Ga_{0.5}As$, and a p-type cladding layer 17 (Zn-doped, 3 to $5\times10^{17}$ cm$^{-3}$) consisting of a p-type $In_{0.5}(Ga_{0.3}Al_{0.7})_{0.5}As$. The cladding layer 17 is formed in a stripe-mesa shape, and a p-type cap layer 18 (Zn-doped, $1\times10^{18}$ cm$^{-3}$) consisting of p-type $In_{0.5}Ga_{0.5}$ is formed on the cladding layer 17.

In this case, amounts of In, Ga, and Al in the compositions of these layers are determined such that the lattice constant of each of the layers 13 to 17 of a double heterojunction and the cap layer 18 is equal to that of the GaAs substrate 11 and that the bandgap energy of each of the cladding layers 13 and 15 is larger than that of the active layer 14.

A current confining layer 19 consisting of n-type GaAs is formed on the side of the cladding layer 17, and a contact layer 20 (Zn-doped, $5\times10^{18}$ cm$^{-3}$) consisting of p-type GaAs is formed on the current confining layer 19 and the cap layer 18. At this time, as shown in FIG. 1, the current confining layer 19 is also formed in one facet portion (the front surface) in the resonator direction, and this current confining layer 19 serves as a current blocking region. The current blocking region has a length of 25 $\mu$m. A p-side electrode 21 is formed on the upper surface of the contact layer 20, and an n-side electrode 22 is formed on the lower surface of the substrate 11. In addition, a highly reflective coating layer 23 consisting of a dielectric film such as a multi-layered film of $Al_2O_3$-Si is formed on the other facet (the rear surface) in the resonator direction.

An optical waveguide operation is performed by the cladding layers 15 and 17 formed in a stripe-mesa shape. The thickness of the cladding layer 13 is set to be 0.8 $\mu$m, the thickness of the active layer 14 is set to be 0.05 $\mu$m, and the thickness of the cladding layers 15 and 17 at a ridge portion is set to be 0.8 $\mu$m. The thickness of the etching stop layer 16 is set to be 0.02 $\mu$m, and the width of a mesa bottom portion is set to be 5 $\mu$m. The buffer layer 12 is formed to improve the quality of InGaAlP crystal formed on GaAs, and it is not necessary required.

The above-described semiconductor laser shown in FIG. 1 has the following characteristic features. That is, the layer having a low reflectance of 20% is formed on the front facet (the side having the current blocking region), the highly reflective coating layer 23 having a high reflectance of 95% is formed on the rear facet, and the plane direction of the substrate 1 and the thickness of the active layer 14 are optimized. Basic arrangements other than the above arrangement are the same as those of a semiconductor laser having a conventional current blocking structure.

The following structure is proposed. That is, after the p-type GaAs contact layer 20 is grown, Zn is selectively diffused in the p-type cladding layer 15 under the n-type GaAs current confining layer 19 to disorder the natural superlattice of the active layer 14, and the current blocking region is used as a window portion. However, in the first embodiment, the diffusion is not performed, and the bandgap of the active layer 14 in the current blocking region is equal to that of each of other stripe portions. In a laser having a window structure in which a natural superlattice is disordered, long-period reliability is degraded by disordering the natural superlattice. However, this problem is avoided in the structure of the first embodiment.

In order to obtain a laser having an improved COD level and high reliability even in a high-output operation, the structure parameters of the semiconductor laser including a facet coating layer must be set within predetermined ranges. These structure parameters are merely examples. Optimization of the structure parameters will be described mainly in a case wherein the peak of a gain in an a laser having a current blocking structure is shifted to a long wavelength direction.

First, absorption of oscillation light in facet portions of the semiconductor laser will be described below. In general, the bandgap of a semiconductor depends on temperatures, and the light absorption of the semiconductor is actually influenced by the concentration of excited carriers. A light absorption coefficient of incident light considerably depends on a wavelength near the bandgap of the semiconductor. In addition, in facet portions of the semiconductor laser, an actual bandgap is decreased due to formation of a surface level or the like.

Since a current is not injected in a facet portion of the laser of the current blocking structure, an increase in temperature is suppressed. When the temperature is calculated in consideration of the thermal conductivity of semiconductor layers such as an InGaAlP layer and a GaAs layer, it falls within a range of 20° to 30° C. When this value is converted into a bandgap, the peak of a gain of the laser is shifted to a short wavelength side by 4 to 6 nm. On the other hand, since injection of carriers is suppressed, a large number of non-excited carriers are present, and light absorption tends to increase in the facet portion.

However, a direct transition type semiconductor used as an active layer of a semiconductor laser has an absorption coefficient that is changed by an incident light intensity, and the semiconductor has a property of absorbing supersaturation, i.e., the semiconductor becomes transparent when the absorption coefficient is larger than a predetermined value. At the COD level, of light intensity that is referred to in the embodiment, an increase in light absorption caused by injecting no carrier can be neglected.

As an important factor capable of controlling absorption of oscillation light in facet portions of the laser having a current blocking structure, the peak of an oscillation wavelength, i.e., a gain, is shifted to a long wavelength direction as much as possible. In a facet emission laser in the first embodiment, since a carrier loss occurs in the resonator direction, the peak of the gain is set at a point which is shifted from a band edge toward the long wavelength side by about 10 nm.

When the peak of the gain can be further shifted to the long wavelength side in the laser having the current blocking structure, the bandgap of the facet is shifted to a short wavelength side by suppressing the above-mentioned increase in temperature, thereby sharply decreasing the light absorption of the facet portion. When a peak difference between the band edge and the gain becomes about 20 nm, the COD level can be increased to a pseudo level equal to the COD level of a window structure. When the peak difference is 20 nm or less, since light absorption of the facet portion can be decreased, reliability can be remarkably improved.

In this case, as a method of shifting the peak of a gain to a long wavelength side, the following methods are known.

(1) A current density and a carrier concentration are decreased during oscillation.

(2) Crystal growth conditions are optimized.

According to method (1), a characteristic feature of a gain is that the peak of the gain is shifted to the long wavelength side as an injected carrier concentration is decreased. More specifically, the present inventors obtain the effect by applying a highly reflective layer, optimizing the thickness of an active layer, and forming a current blocking layer in only the facet portion. Since the highly reflective layer can decrease a reflection loss, it can allow laser operation at a decreased current density and a decreased carrier concentration. When the highly reflective layer has a reflectance that is higher than that of a native facet, the above effect can be obtained. The reflectance of the highly reflective layer is preferably set to be 80% or more to obtain a satisfactory effect. In the first embodiment, since one facet of the laser had a reflectance of 95%, a threshold current value could be decreased by 20%. On the light emission side, the reflectance may be decreased to decrease the light density in the facet such that the threshold current value is not largely increased.

FIG. 2 shows a relationship between the thickness of the active layer and an oscillation wavelength. When the thickness of the active layer is 0.04 $\mu$m or less, the oscillation wavelength begins to be shortened. This is because a threshold current density is increased by an increase in light leakage and because of the essential behavior of the peak of the gain in accordance with an increase in carrier concentration caused by a decrease in thickness of the active layer. Therefore, the thickness of the active layer is preferably set to be 0.04 $\mu$m or more. On the other hand, when the thickness is set to be 0.1 $\mu$m or more, a threshold current density itself is sharply increased, and the light density in the active layer is increased. For this reason, a COD level is decreased, and a high output cannot easily be obtained in the laser having the current blocking structure of the embodiment. Therefore, the thickness of the active layer is preferably set to be 0.1 $\mu$m or less.

According to the above method, since a loss is minimized in the current blocking region, a threshold value or the like cannot be easily increased. However, in consideration of facilitation of cleavage, the blocking region is preferably formed in only one facet portion of the laser.

According to method (2), the present inventors found a remarkable effect by using a substrate having a major surface axially inclined from [100] to [010] directions. FIG. 3 shows a relationship between the inclination angle of a plane direction of the substrate surface and a difference between an oscillation wavelength and a PL wavelength (corresponding to a band end). Although the oscillation wavelength was generally set to be 10 nm, when the plane direction was inclined at angle of 2° or more, the wavelength was increased to 15 nm. Although the reason for this phenomenon was not apparent, the phenomenon is regarded as a phenomenon related to disordering of a natural superlattice.

As described above, the semiconductor laser (FIG. 1) having the optimized structure parameters was oscillated at a threshold value of 50 mA when the resonator length was set to be 400 $\mu$m, and the COD was not performed until the output level of the laser reached 100 mW. FIG. 4 shows the reliability of each of a normal semiconductor laser, a semiconductor laser having a current blocking structure, and a semiconductor laser having a current blocking structure having one facet on which a highly reflective layer is formed. The normal laser was degraded after the laser was operated for several hundred hours under conditions of 50° C. and 20 mW, and the blocking semiconductor laser was degraded after the laser was operated for 1,000 hours. However, the blocking laser having the highly reflective coating layer could be stably operated for 2,000 hours or more.

As described above, in the semiconductor laser according to the first embodiment, in addition to the current blocking structure, the highly reflective layer 23 is formed on one facet, and the plane direction of the substrate 11 and the thickness of the active layer 14 are optimized. For these reasons, an oscillation wavelength can be shifted to a long wavelength side. Therefore, since light absorption in the facet portion is suppressed to increase an COD level, a high output can be obtained, and the reliability of the laser can be improved.

FIG. 5 is a sectional view showing an arrangement of a semiconductor laser according to the second embodiment of the present invention. The second embodiment is different from the above-described first embodiment in the following point. That is, a distributed feedback (DFB) structure using a diffraction grating is used to further positively shift a wavelength of a emitting light to a long wavelength side.

Reference numeral 51 denotes an n-type GaAs substrate having a plane direction inclined at an angle of 5° from [100] to [010] directions. An n-type GaAs buffer layer 52 is formed on the substrate 51. A double heterojunction structure constituted by an n-type InGaAlP cladding layer 53, an InGaP active layer 54, a p-type $In_{0.5}(Ga_{0.65}Al_{0.35})_{0.5}P$ first optical guide layer 55, a p-type $In_{0.5}(Ga_{0.9}Al_{0.1})_{0.5}P$ second optical guide layer 56, and a p-type InGaAlP cladding layer 57 is formed on the buffer layer 52. A p-type $In_{0.5}Ga_{0.5}P$ cap layer 58 (Zn-doped, $1 \times 10^{18}$ cm$^{-3}$) is formed on the cladding layer 57. A large number of grooves are formed in the surface of the second optical guide layer 56, thereby constituting a diffraction grating.

The compositions and impurity doping amounts of the cap layer 58 and the layers of the double heterojunction except for the optical guide layers 55 and 56 are set to be equal to those in the first embodiment. Although the PL wavelength (corresponding to a band end) of the active layer 54 is 660 nm, the period of the diffraction grating formed in the second optical guide layer 56 is set to be coupled with a wavelength of 680 nm.

Note that the distributed feedback (DFB) structure is the structure in which laser oscillation is induced and oscillation wavelength is controlled by a diffraction grating formed in a resonator.

An n-type GaAs current confining layer 59 is formed on the double heterojunction except for a stripe portion, and a p-type GaAs contact layer 60 is formed on the current confining layer 59 and the cap layer 58. The current confining layer 59 forms a stripe in a junction plane parallel direction. As shown in FIG. 5, the current confining layer 59 is also formed in the front facet portion to form a current blocking structure. The length of a current blocking region is set to be 25 μm. A p-side electrode 61 is formed on the upper surface of the contact layer 60, and an n-side electrode 62 is formed on the lower surface of the substrate 51. Furthermore, a highly reflective layer 63 having a reflectance of 95% is formed on the rear facet of the resultant structure.

In the second embodiment, as a method of shifting the peak of a gain to a long wavelength side, a DFB structure is positively used. A peak difference between the combination wavelength of the diffraction grating constituting the DFB structure and a band edge is set to be 50 meV in terms of energy. In this structure, an oscillation wavelength capable of preventing light absorption of a facet portion can be easily set. FIG. 6 shows a relationship between a COD level and a peak difference between the combination wavelength of the diffraction grating and the band end. When the peak difference was 35 meV or less, the COD level was set to be about 15 mV. When the peak difference was 35 meV or more, COD was rarely caused.

Other methods of shifting the peak of a gain to a long wavelength side, as described in the first embodiment, are exemplified as a method in which a current density and a carrier concentration during oscillation are decreased, and a method in which crystal growth conditions are optimized. Also in the second embodiment, when either method is used, a longer wavelength can be obtained.

As described above, the semiconductor laser (FIG. 5) having the optimized structure parameters was oscillated at a threshold value of 55 mA when the resonator length was set to be 400 μm, and COD was not caused until the output level of the laser reached 120 mW.

In the other embodiment of the present invention, the present invention can be applied to a semiconductor laser device in which an active layer and cladding layers consist essentially of group II–VI compound semiconductor with improvement in COD level. Thus, since output characteristics are generally limited by COD in the semiconductor laser emitting visible light, the present invention can be effectively applied to the semiconductor laser emitting visible light.

The present invention is not limited to the above embodiments. In the above embodiments, although an active layer consists of InGaP, the active layer may consist of an InGaAlP quarternary mixed crystal. Other materials containing As, N, Zn, Se, B, and the like may be used as the materials of the active layer and a cladding layer. The structure of the semiconductor laser is not limited to the structures shown in FIGS. 1 to 5, and the structure of the semiconductor laser can be properly changed in accordance with specifications. In addition, an oscillation wavelength can be controlled by not only the DFB structure but a structure obtained by arranging a wavelength control structure outside a laser. Various changes and modifications may be effected without departing from the spirit and scope of the present invention.

As described above, according to the present invention, in a semiconductor laser having a current blocking structure in a facet portion of the semiconductor laser, the peak wavelength of a gain is shifted to a long wavelength side to suppress light absorption in the facet portion. Therefore, a semiconductor laser device having a high COD level and sufficiently excellent high-output characteristics can be obtained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor laser device including:
   a compound semiconductor substrate;
   a double hetero structure that is formed on said compound semiconductor substrate and having an active layer and first and second cladding layers which sandwich said active layer, said double hetero structure having opposing first and second facets;
   a current blocking region formed on said double hetero structure and on one facet side that is nearer to the first facet than to the second facet;
   reflecting means arranged on the second facet and having a reflectance that is higher than that of a natural cleavage surface.

2. A device according to claim 1, wherein said reflecting means has a reflectance of not less than 50%.

3. A device according to claim 1, wherein said reflecting means has a reflectance of not less than 90%.

4. A device according to claim 1, wherein said reflecting means is a coating layer consisting essentially of a dielectric film.

5. A device according to claim 1, wherein said active layer has a thickness of not less than 0.04 μm.

6. A device according to claim 1, wherein said active layer has a thickness of 0.04 to 0.1 μm.

7. A device according to claim 1, wherein said compound semiconductor substrate is a GaAs substrate having a plane direction inclined from [100] to [010] at an angle of not less than 2°.

8. A device according to claim 1, wherein said double hetero structure consists essentially of an InGaAlP-based material.

9. A device according to claim 1, wherein said double hetero structure consists essentially of a group II–VI compound.

10. A laser according to claim 1, wherein the length of the current blocking region along a direction extending between the first and second facets is greater than a wavelength of laser light generated by the laser and corresponding to a band gap of the active layer.

11. The laser according to claim 1, wherein there is no current blocking region along at least one region between the first and second facets, said one region extending along a direction extending between the first and second facets for more than a wavelength of light corresponding to a band gap of the active layer.

12. The device according to claim 11, wherein said at least one region comprises a central portion of the double hetero structure.

13. A semiconductor laser device including:
    a compound semiconductor substrate;
    a double hetero structure that is formed on said compound semiconductor substrate and having an active layer and first and second cladding layers which sandwich said active layer, said double hetero structure having opposing first and second facets;
    a current blocking region formed on said double hetero structure and on one facet side that is nearer to the first facet than to the second facet; and
    a wavelength control structure for performing a control operation for shifting an oscillation wavelength of said active layer to a long wavelength side corresponding to a bandgap that is smaller than a bandgap of said active layer by not less than 35 meV.

14. A device according to claim 13, wherein said wavelength control structure has a distributed feedback structure including a diffraction grating.

15. A device according to claim 14, wherein said compound semiconductor substrate is a GaAs substrate having a plane direction inclined from [100] to [010] at an angle of not less than 2°.

16. A device according to claim 13, further comprising reflecting means arranged on at least one of facets of said double hetero structure in the resonator direction and having a reflectance that is higher than that of a natural cleavage surface.

17. A device according to claim 16, wherein said reflecting means has a reflectance of not less than 50%.

18. A device according to claim 16, wherein said reflecting means has a reflectance of not less than 90%.

19. A device according to claim 16, wherein said reflecting means is a coating layer consisting essentially of a dielectric film.

20. A device according to claim 13, wherein said active layer has a thickness of not less than 0.04 μm.

21. A device according to claim 13, wherein said active layer has a thickness of 0.04 to 0.1 μm.

22. A device according to claim 13, wherein said double hetero structure consists essentially of an InGaAlP-based material.

23. A laser according to claim 13, wherein the length of the current blocking region along a direction extending between the first and second facets is greater than a wavelength of laser light generated by the laser corresponding to a band gap of the active layer.

24. The laser according to claim 13, wherein there is no current blocking region along at least one region between the first and second facets, said one region extending along a direction extending between the first and second facets for more than a wavelength of light corresponding to a band gap of the active layer.

25. The device according to claim 24, wherein said at least one region comprises a central portion of the double hetero structure.

26. A semiconductor laser device including:
    a compound semiconductor substrate;
    a double hetero structure that is formed on said compound semiconductor substrate and having an active layer and first and second cladding layers which sandwich said active layer, said double hetero structure having opposing first and second facets;
    a current blocking region formed on said double hetero structure and in one facet side that is nearer to the first facet than to the second facet; and
    means for shifting an oscillation wavelength of said laser device to a long wavelength side with respect to a wavelength of spontaneous radiation emitted from said double hetero structure.

27. A laser according to claim 26, wherein the length of the current blocking region along a direction extending between the first and second facets is greater than a wavelength of laser light generated by the laser corresponding to a band gap of the active layer.

28. The laser according to claim 26, wherein there is no current blocking region along at least one region between the first and second facets, said one region extending along a direction extending between the first and second facets for more than a wavelength of light corresponding to a band gap of the active layer.

29. The device according to claim 28, wherein said at least one region comprises a central portion of the double hetero structure.

30. A semiconductor laser device, comprising
a compound semiconductor substrate;
a double hetero structure that is formed on the compound semiconductor substrate and which includes an active layer and first and second cladding layers which sandwich the active layer between them, said double hetero structure having opposing first and second facets that oppose one another along a first direction;
a current blocking region which continuously extends along the first direction for only a fraction of the length between the first and second facets, but for at least the length of the wavelength in the active layer of laser light that is generated by the laser; and
means for injecting current into the active region.

* * * * *